United States Patent [19]

Fox

[11] Patent Number: 4,901,072
[45] Date of Patent: Feb. 13, 1990

[54] POSITION DETECTOR UTILIZING GRAY CODE FORMAT

[75] Inventor: David A. Fox, Shawnee Township, Allen County, Ohio

[73] Assignee: Westinghouse Electric Corp., Pittsburgh, Pa.

[21] Appl. No.: 156,690

[22] Filed: Feb. 17, 1988

[51] Int. Cl.[4] ............................................. H03M 1/24
[52] U.S. Cl. ......................................... 341/10; 341/2; 341/13; 341/15
[58] Field of Search ........................ 341/1, 2, 9, 10, 13, 341/15, 16, 17; 250/231 SE, 566, 568, 570; 364/559; 318/603, 652

[56] References Cited

U.S. PATENT DOCUMENTS

| 4,345,240 | 8/1982 | Amano et al. | 341/16 |
|---|---|---|---|
| 4,382,250 | 5/1983 | Radaelli | 340/347 D |
| 4,443,788 | 4/1984 | Breslow | 340/347 D |
| 4,445,110 | 4/1984 | Breslow | 250/231 SE |
| 4,465,928 | 8/1984 | Breslow | 340/347 D |
| 4,604,725 | 8/1986 | Davies et al. | 364/900 |
| 4,606,008 | 8/1986 | Wason | 364/560 |
| 4,621,256 | 11/1986 | Rusk | 340/347 D |
| 4,628,298 | 12/1986 | Hafle et al. | 340/347 D |
| 4,766,359 | 8/1988 | Smith et al. | 318/652 |

FOREIGN PATENT DOCUMENTS 6199417  10/1984  Japan ..................................... 341/15

Primary Examiner—William M. Shoop, Jr.
Assistant Examiner—Brian K. Young
Attorney, Agent, or Firm—R. P. Lenart

[57] ABSTRACT

A position detector is provided with an encoded element having indicia representative of a bit pattern of a pair of bits of a Gray code and a pair of sensors responsive to this indicia. The encoded element is capable of being mechanically coupled to a movable member and the sensors are spaced apart by a distance corresponding to a shift in the bit pattern between two bits of the Gray code such that movement of the encoded element past the sensors is used to produce two bits of the Gray code. Additional encoded elements and sensors are used to produce additional bits of the Gray code.

9 Claims, 4 Drawing Sheets

POSITION DETECTOR UTILIZING GRAY CODE FORMAT

BACKGROUND OF THE INVENTION

This invention relates to position detectors and, more particularly, to such detectors which produce a digital indication of the position of a movable mechanical member.

Many mechanical devices require the reliable measurement of the position of a movable element. For rotating elements such as the shafts of dynamoelectric machines, the angular position of the shafts can be determined through the use of commercially available shaft encoders. However, in certain applications such encoders are not acceptable. For example, position sensors required for the rotating shafts of brushless DC motors or AC starters for aircraft engines, must meet severe size and environmental requirements.

Magnetic types of position detectors are mechanically rugged. These types include permanent magnet voltage pickups or variable reluctance types of sensors. Voltage pickup types will not operate at very low speeds. Therefore, motor applications requiring operation at or near zero revolutions per minute must use the variable reluctance type of sensor.

Reluctance sensors typically use a toothed wheel which passes near an AC excited coil, varying the reluctance and therefore the inductance of the coil. The inductance change produces a detectable change in current or frequency of an oscillator which is resolved into a discrete logic level. A typical four bit sensor uses four toothed wheels and four coils to produce a digital word. The four bit word would provide a detector resolution of one part out of 16.

It is well known that linear and rotary encoders use so called Gray codes to avoid ambiguous readings as the bits change between digital words. Gray codes (which may have redundant bits) change only one bit at a time between adjacent positions. That is, adjacent words are identical except for one bit position.

SUMMARY OF THE INVENTION

This invention provides a position detector which produces a digital output in the form of Gray codes, but does not require a separate encoded element and sensor for each bit of the Gray code data words.

Position detectors constructed in accordance with this invention include an encoded element which has indicia representative of a bit sequence of a pair of bits in a Gray code and is capable of being mechanically coupled to a movable member. A pair of sensors are positioned adjacent to the encoded element such that the sensors produce digital signals in response to the indicia. The sensors are mechanically spaced from each other by an amount which corresponds to the amount of shift of the bit sequence between the pair of bits in the Gray code.

For four bit resolution, a second encoded element, which is also capable of being mechanically coupled to the movable member, is included. Two additional sensors are positioned adjacent to the second encoded element and mechanically spaced apart from each other by an amount corresponding to a shift of a second bit sequence between a second pair of bits. This second pair of sensors is responsive to indicia on the second encoded element which is representative of the second bit sequence.

In an alternative embodiment, only one sensor is associated with the second encoded element and a third encoded element is provided to operate in conjunction with the last sensor.

By using Gray codes which include identical but shifted bit sequences in two or more bits, this invention reduces the number of required encoded elements for a given position resolution. This is accomplished through the use of mechanically spaced sensors which respond to indicia representative of the bit sequence on a single encoded element that is coupled to the movable member.

BRIEF DESCRIPTION OF THE DRAWINGS

The invention will become more readily apparent from the following description of the preferred embodiments thereof, shown by way of example only, in the accompanying drawings wherein.

DESCRIPTION OF THE PREFERRED EMBODIMENTS

Position detectors constructed in accordance with this invention produce digital data word outputs corresponding to the mechanical position of an associated movable member. The data words are in the form of Gray codes having at least two bits which contain identical bit sequences that are shifted by a predetermined number of position indications. Four bit Gray codes having two pairs of such identical repetitive bit sequences are illustrated by the logic diagrams of bit sequences indicated in FIGS. 1 and 2. A four bit code provides one in 16 resolution as illustrated by the position indications ranging from zero to 15. These position indications may correspond to angular positions of a rotating shaft, or specific positions of a linearly movable member.

Figure 1:
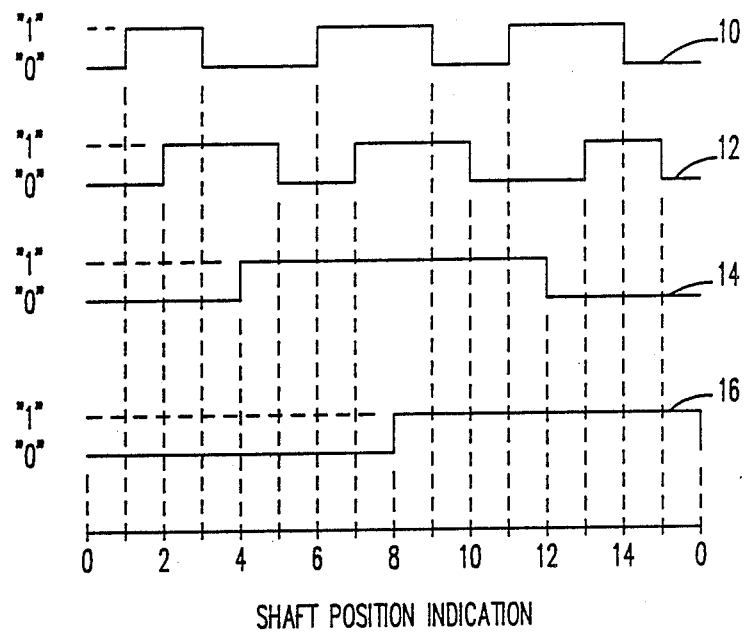
FIGS. 1 and 2 are logic diagrams illustrating the bit sequences of four bit Gray code data words produced by position detectors of the present invention.

In FIG. 1, bit sequences 10 and 12 are seen to be identical to each other but shifted by four position indication numbers. Similarly, bit sequences 14 and 16 are identical to each other but shifted by four position indication numbers. Starting at position indication number 9 bit sequence 10 is shown to include two zero bits, three one bits, three zero bits, two one bits, three zero bits, and three one bits. Bit sequence 12 is seen to be identical if one starts at position indication number 5. Bit sequences 14 and 16 both include eight zero bits followed by eight one bits and bit sequence 16 is shifted by four position indication numbers with respect to bit sequence 14.

Figure 2:
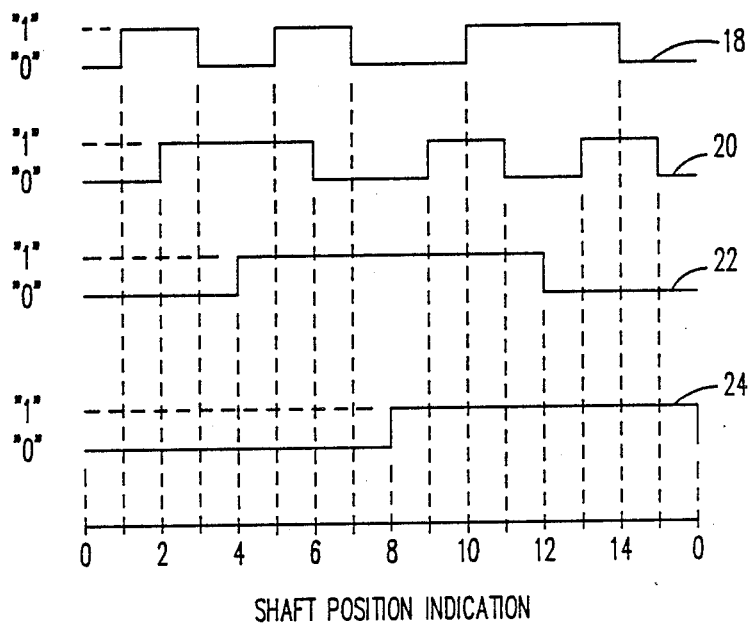

Referring to FIG. 2, starting at position indication number 1, bit sequence 18 is shown to include two one bits, two zero bits, two one bits, three zero bits, four one bits, and three zero bits. This same bit sequence is found in bit sequence 20 starting at position indication 9. Bit sequences 22 and 24 are similar to bit sequences 14 and 16 in FIG. 1.

Tables I and II illustrate all four bit Gray codes having sequences corresponding to FIGS. 1 and 2 respectively.

TABLE I

Four Bit Gray Codes Having Bit Sequences Corresponding to FIG. 1

| | GC1 | GC2 | GC3 | GC4 | GC5 | GC6 | GC7 | GC8 |
|---|---|---|---|---|---|---|---|---|
| N | DCBA | DCBA | DCBA | DCBA | DCBA | DCBA | DCBA | DCBA |
| 0 | 0000 | 0000 | 0000 | 0000 | 0000 | 0000 | 0000 | 0000 |
| 1 | 0001 | 0001 | 0001 | 0001 | 0001 | 0001 | 0001 | 0001 |
| 2 | 0011 | 0011 | 0011 | 0011 | 0011 | 0011 | 0011 | 0011 |
| 3 | 0010 | 0010 | 1011 | 0111 | 0111 | 0111 | 1011 | 1011 |
| 4 | 0110 | 1010 | 1001 | 0110 | 0110 | 0101 | 1010 | 1010 |
| 5 | 0100 | 1000 | 1101 | 0100 | 0010 | 1101 | 1000 | 0010 |
| 6 | 0101 | 1001 | 0101 | 0101 | 1010 | 1001 | 1001 | 0110 |
| 7 | 0111 | 1011 | 0111 | 1101 | 1011 | 1011 | 1101 | 0111 |
| 8 | 1111 | 1111 | 1111 | 1111 | 1111 | 1111 | 1111 | 1111 |
| 9 | 1110 | 1110 | 1110 | 1110 | 1110 | 1110 | 1110 | 1110 |
| 10 | 1100 | 1100 | 1100 | 1100 | 1100 | 1100 | 1100 | 1100 |
| 11 | 1101 | 1101 | 0100 | 1000 | 1000 | 1000 | 0100 | 0100 |
| 12 | 1001 | 0101 | 0110 | 1001 | 1001 | 1010 | 0101 | 0101 |
| 13 | 1011 | 0111 | 0010 | 1011 | 1101 | 0010 | 0111 | 1101 |
| 14 | 1010 | 0110 | 1010 | 1010 | 0101 | 0110 | 0110 | 1001 |
| 15 | 1000 | 0100 | 1000 | 0010 | 0100 | 0100 | 0010 | 1000 |

TABLE II

Four Bit Gray Codes Having Bit Sequences Corresponding to FIG. 2

| | GC9 | GC10 | GC11 | GC12 | GC13 | GC14 | GC15 | GC16 |
|---|---|---|---|---|---|---|---|---|
| N | DCBA | DCBA | DCBA | DCBA | DCBA | DCBA | DCBA | DCBA |
| 0 | 0000 | 0000 | 0000 | 0000 | 0000 | 0000 | 0000 | 0000 |
| 1 | 0001 | 0001 | 0001 | 0001 | 0001 | 0001 | 0001 | 0001 |
| 2 | 0011 | 0011 | 0011 | 0011 | 0011 | 0011 | 0011 | 0011 |
| 3 | 0010 | 0010 | 0010 | 0010 | 1011 | 0111 | 0111 | 1011 |
| 4 | 0110 | 0110 | 1010 | 1010 | 1001 | 0110 | 0101 | 1010 |
| 5 | 0111 | 0111 | 1011 | 1011 | 1101 | 0100 | 1101 | 1000 |
| 6 | 0101 | 1111 | 1001 | 1111 | 1111 | 0101 | 1111 | 1001 |
| 7 | 0100 | 1011 | 1000 | 0111 | 0111 | 1101 | 1011 | 1101 |
| 8 | 1100 | 1010 | 1100 | 0110 | 0101 | 1100 | 1001 | 1100 |
| 9 | 1110 | 1110 | 1110 | 1110 | 0100 | 1110 | 1000 | 1110 |
| 10 | 1111 | 1100 | 1111 | 1100 | 1100 | 1111 | 1100 | 1111 |
| 11 | 1101 | 1000 | 1101 | 0100 | 1110 | 1011 | 1110 | 0111 |
| 12 | 1001 | 1001 | 0101 | 0101 | 0110 | 1001 | 1010 | 0101 |
| 13 | 1011 | 1101 | 0111 | 1101 | 0010 | 1000 | 0010 | 0100 |
| 14 | 1010 | 0101 | 0110 | 1001 | 1010 | 1010 | 0110 | 0110 |
| 15 | 1000 | 0100 | 0100 | 1000 | 1000 | 0010 | 0100 | 0010 |

Notice that each of the Gray codes illustrated in Tables I and II includes two basic bit sequences and each of these bit sequences is found in two bits of the data words. For the purposes of this discussion, corresponding bits are defined as bits having identical bit sequences which are shifted by a given number of position indications. Table III lists the corresponding bit sequences in the Gray codes GC1-GC16 illustrated in Tables I and II.

TABLE III

Corresponding Bit Sequences In Gray Codes GC1-GC16

| Code | Corresponding Sequence Bits | |
|---|---|---|
| GC1 | D-C | B-A |
| GC2 | D-C | B-A |
| GC3 | D-B | C-A |
| GC4 | D-C | B-A |
| GC5 | D-B | C-A |
| GC6 | D-A | C-B |
| GC7 | D-C | B-A |
| GC8 | D-A | C-B |
| GC9 | D-C | B-A |
| GC10 | D-B | C-A |
| GC11 | D-C | B-A |

TABLE III-continued

Corresponding Bit Sequences In Gray Codes GC1-GC16

| Code | Corresponding Sequence Bits | |
|---|---|---|
| GC12 | D-A | C-B |
| GC13 | D-B | C-A |
| GC14 | D-C | B-A |
| GC15 | D-A | C-B |
| GC16 | D-C | B-A |

It should be noted that in Table II above, Gray codes GC10, GC12, GC14 and GC16 include bit sequences which have logic levels which are the inverse of the bit sequences 18 and 20 illustrated in FIG. 2.

Figure 3:
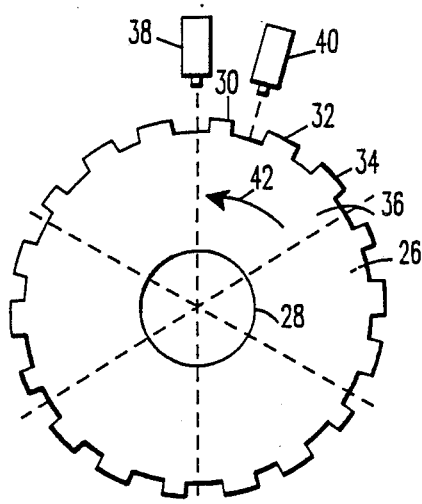
FIGS. 3, 4 and 5 are schematic diagrams of toothed wheels and associated sensors which may be used to produce the bit sequences represented by FIGS. 1 and 2.
Figure 4:
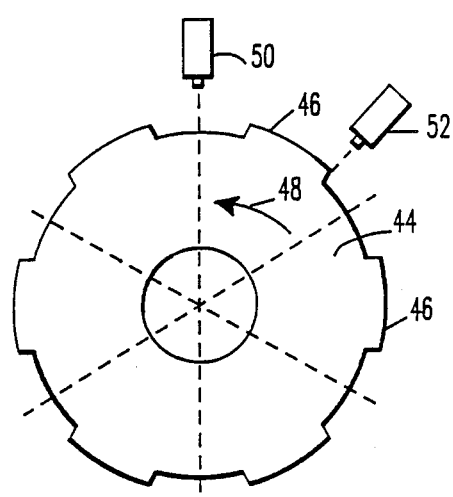
Figure 5:
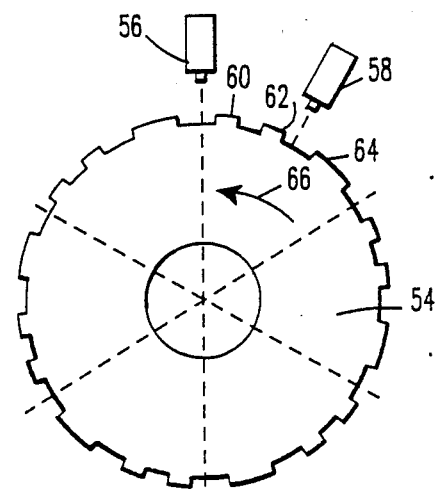

This invention takes advantage of the symmetry of the Gray code bit patterns illustrated above to reduce the number of required encoded elements needed to produce a Gray code output having a given resolution. FIGS. 3, 4 and 5 are schematic representations of toothed wheels which serve as encoded elements for producing the Gray code bit sequences of FIGS. 1 and 2.

Wheel 26 in FIG. 3 is designed to be mounted on a rotating shaft which would pass through opening 28 and would be used in a position detector that detects the angular position of the shaft. The wheel includes six sectors each having a plurality of teeth 30, 32 and 34 which are sized and spaced to serve as indicia representative of bit sequence 10 in FIG. 1. Wheel 26 is divided into six identical sectors and would be useful in the control of a 12 pole dynamoelectric machine since that electrical machine would include six electrical revolutions for each mechanical revolution. Wheel sector 36 is used to produce two identical, but shifted, bit patterns in a four bit Gray code corresponding to the 16 shaft position indications generated as the wheel rotates past sensors 38 and 40 in the direction indicated by arrow 42. With the sensor positions illustrated in FIG. 3, sensor 38 produces bit pattern 10 of FIG. 1 and sensor 40 produces bit pattern 12 of FIG. 1. As illustrated, both sensors are initially shown between teeth such that they initially give a logic zero output corresponding to shaft position indication zero in FIG. 1. As wheel 26 rotates, sensors 38 and 40 will produce identical bit sequence outputs. The shift in these bit sequences illustrated in FIG. 1 is produced by the mechanical spacing between sensors 38 and 40. In this embodiment, that spacing corresponds to four shaft position indication numbers or ¼ of the angle encompassed by sector 36.

FIG. 4 illustrates a toothed wheel 44 having encoded indicia in the form of peripheral teeth 46 which are spaced such that as wheel 44 rotates in the direction illustrated by arrow 48, sensor 50 will produce bit sequence 14 and sensor 52 will produce bit sequence 16. To achieved the proper bit sequence shift, sensors 50 and 52 are spaced apart by a distance corresponding to 12 shaft position indication numbers.

The arrangement of FIG. 4 is also used to produce bit sequences 22 and 24 of FIG. 2. To produce bit sequences 18 and 20, the combination of wheel 54 and sensors 56 and 58 is used. The wheel 54 includes six sectors each having peripheral teeth 60, 62 and 64. The widths of teeth 60 and 62 correspond to two shaft position indication numbers while the widths of teeth 64 correspond to four shaft position indication numbers. These teeth are spaced along the periphery of wheel 54 such that the distance between teeth represents the logic zero in the shaft position indication numbers illustrated in bit sequences 18 and 20. Wheel 54 rotates in the direction indicated by arrow 66.

Figure 6:
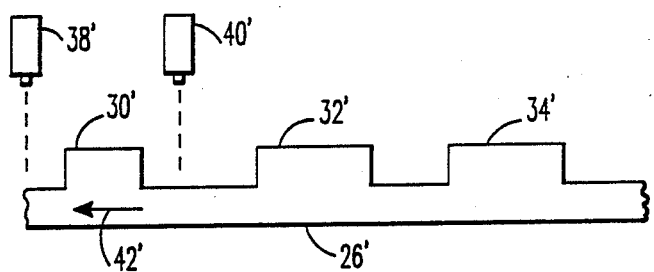
FIGS. 6, 7 and 8 are schematic diagrams of linear encoded elements and associated sensors, which may be used to produce the Gray code bit sequences represented by FIGS. 1 and 2.
Figure 7:
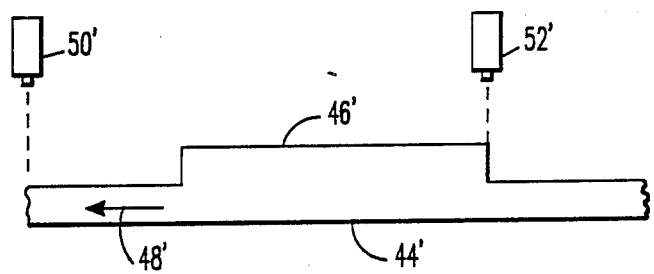
Figure 8:
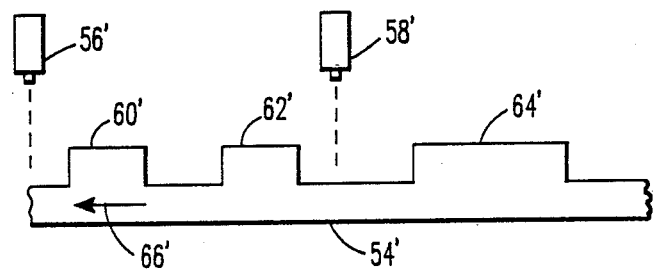

FIGS. 6, 7 and 8 illustrate alternative encoded elements which may be used in the present invention for the detection of a linear change in position of a movable member. These elements would be attached or otherwise coupled to a linearly movable member. They correspond directly to the toothed wheels of FIGS. 3, 4 and 5 with corresponding elements being designated by primed numbers. The width of the teeth and the distances between those teeth in FIGS. 6, 7 and 8 correspond directly to the production of bit sequences 10, 14 and 18 in FIGS. 1 and 2.

It should now be apparent to those skilled in the art that Gray codes GC1-GC16 in Tables I and II can be produced by the use of two encoded elements with two sensors positioned adjacent to each of those elements, wherein the sensors are spaced apart by a distance corresponding to the shift between bit sequences in corresponding bits of the Gray codes.

Other four bit Gray codes exist wherein only two of the four bits contain identical but shifted bit sequences. Table IV illustrates one such four bit Gray code.

TABLE IV

| Four Bit Gray Code Having Two Bit Sequences Of Eight Zeros and Eight Ones, Shifted By Four Numbers | |
|---|---|
| N | DCBA |
| 0 | 0000 |

TABLE IV-continued

| Four Bit Gray Code Having Two Bit Sequences Of Eight Zeros and Eight Ones, Shifted By Four Numbers | |
|---|---|
| N | DCBA |
| 1 | 0001 |
| 2 | 0011 |
| 3 | 0010 |
| 4 | 0110 |
| 5 | 0111 |
| 6 | 0101 |
| 7 | 0100 |
| 8 | 1100 |
| 9 | 1101 |
| 10 | 1111 |
| 11 | 1110 |
| 12 | 1010 |
| 13 | 1011 |
| 14 | 1001 |
| 15 | 1000 |

Figure 9:
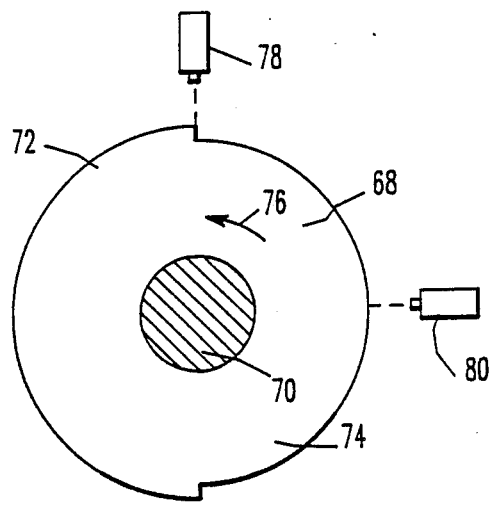
FIGS. 9, 10 and 11 are schematic representations of encoded elements and associated sensors, used to produce the Gray code illustrated in Table IV below.
Figure 10:
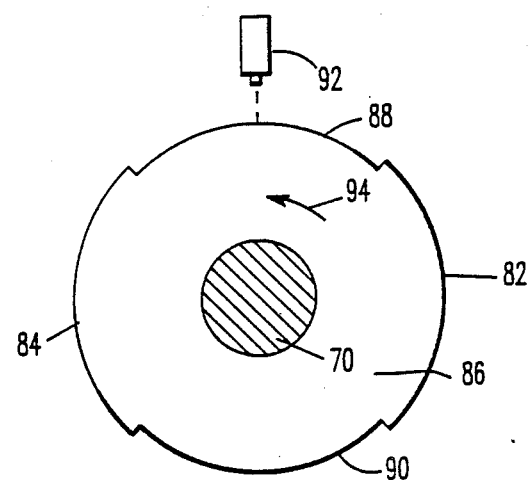
Figure 11:
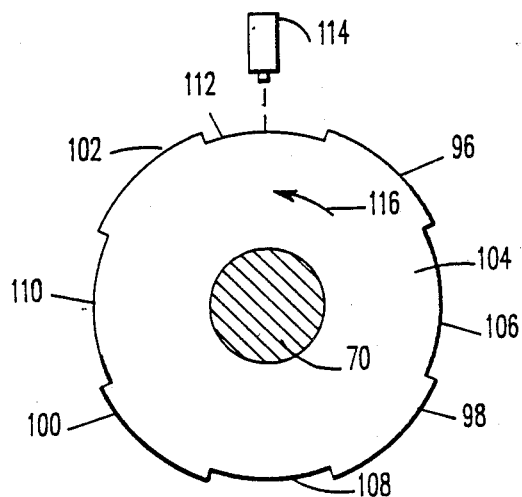

In the Gray code of Table IV, bits C and D include sequences of eight zeros and eight ones, shifted by four numbers N. It is therefore possible to use a single encoded element with two associated sensors to produce bits C and D and two additional encoded elements, each with its own sensor to produce bits B and A. FIGS. 9, 10 and 11 illustrate wheels which accomplish this function.

In FIG. 9, wheel 68 mounted on shaft 70 includes an elevated portion 72 corresponding to eight sequential one bits per revolution and a second portion 74 corresponding to eight sequential zero bits. As the wheel 68 rotates in the direction indicated by arrow 76 past sensors 78 and 80, the bit sequences for bits D and C of the Gray code of Table IV are produced. Similarly, in FIG. 10 the raised portions 82 and 84 on wheel 86 produce the ones in bit B, while the depressed portions 88 and 90 produce the zeros in bit B as wheel 86 turns past sensor 92 in the direction indicated by arrow 94. Raised sections 96, 98, 100 and 102 of wheel 104 in FIG. 11 produce the ones of bit A in Table IV and the recessed sections 106, 108, 110 and 112 of wheel 104 produce the zeros of bit A in Table IV as wheel 104 turns past sensor 114 in the direction indicated by arrow 116.

In the illustrated preferred embodiments, reluctance type sensors which are known in the art would be used in combination with toothed wheels or linear toothed elements constructed of ferromagnetic or other material which produces a change in an electrical characteristic of the sensor. This change is processed in accordance with known techniques to produce the digital output signals used to construct the Gray code.

Although the present invention has been described in terms of what are at present believed to be its preferred embodiments, it will be apparent to those skilled in the art that various changes may be made to these embodiments without departing from the scope of the invention. For example, instead of using a magnetic type encoded element and sensor arrangement, optical sensors could be used in combination with an encoded element having sections of varying reflectivity or transmittance, such as found in known encoder structures. Similarly, magnetic voltage type sensors could be used in combination with magnetic encoded elements. It is therefore intended that such structures are also encompassed by the following claims.

It will also be apparent to those skilled in the art that the advantages of this invention may also apply to Gray codes having more than four bits. It is intended that the application of this invention to such larger codes is also encompassed by the following claims.

What is claimed is:

1. A position detector for providing an indication of the position of a movable member, said detector comprising:
   a first encoded element, having first indicia representative of a first bit sequence of a first pair of bits of a Gray code and capable of being mechanically coupled to a movable member;
   first and second sensors positioned adjacent to said first encoded element, said first and second sensors producing digital signals in response to said first indicia of said first encoded element and being mechanically spaced from each other by an amount corresponding to a shift of said first bit sequence between said first pair of bits;
   a second encoded element, having second indicia representative of a second bit sequence of a second pair of bits of said Gray code and capable of being mechanically coupled to said movable member; and
   third and fourth sensors positioned adjacent to said second encoded element, said third and fourth sensors producing digital signals in response to said second indicia of said second encoded element and being mechanically spaced from each other by an amount corresponding to a shift of said second bit sequence between said second pair of bits.

2. A position detector as recited in claim 1, wherein:
   said first bit sequence includes a repetitive succession of two zero bits, three one bits, three zero bits, two one bits, three zero bits, and three one bits; and
   said second bit sequence includes a repetitive succession of eight zero bits and eight one bits.

3. A position detector as recited in claim 1, wherein:
   said first bit sequence includes a repetitive succession of two zero bits, two one bits, two zero bits, three one bits, four zero bits, and three one bits; and
   said second bit sequence includes a repetitive succession of eight zero bits and eight one bits.

4. A position detector as recited in claim 1, wherein:
   said first bit sequence includes a repetitive succession of two one bits, two zero bits, two one bits, three zero bits, four one bits, and three zero bits; and
   said second bit sequence includes a repetitive succession of eight zero bits and eight one bits.

5. A position detector as recited in claim 1, wherein:
   said first indicia includes a first plurality of teeth, said first plurality of teeth being sized and spaced to represent said first bit sequence; and
   said second indicia includes a second plurality of teeth, said second plurality of teeth being sized and spaced to represent said second bit sequence.

6. A position detector for providing an indication of the position of a movable member, said detector comprising:
   a first encoded element, having first indicia representative of a first bit sequence of a first pair of bits of a Gray code and capable of being mechanically coupled to a movable member;
   first and second sensors positioned adjacent to said first encoded element, said first and second sensors producing digital signals in response to said first indicia of said first encoded element and being mechanically spaced from each other by an amount corresponding to a shift of said first bit sequence between said first pair of bits;
   a second encoded element, having second indicia representative of a second bit sequence of a third bit of said Gray code and capable of being mechanically coupled to said movable member; and
   a third sensor positioned adjacent to said second encoded element, said third sensor producing digital signals in response to said second indicia of said second encoded element.

7. A position detector as recited in claim 6, further comprising:
   a third encoded element, having third indicia representative of a third bit sequence of a fourth bit of said Gray code and capable of being mechanically coupled to said movable member; and
   a fourth sensor positioned adjacent to said third encoded element, said fourth sensor producing digital signals in response to said third indicia of said third encoded element.

8. A position detector as recited in claim 7, wherein:
   said first bit sequence includes a repetitive sequence of eight zero bits and eight one bits;
   said second bit sequence includes a repetitive sequence of four zero bits and four one bits; and
   said third bit sequence includes a repetitive sequence of two zero bits and two one bits.

9. A position detector as recited in claim 6, wherein:
   said first indicia includes a first plurality of teeth, said first plurality of teeth being sized and spaced to represent said first bit sequence; and
   said second indicia includes a second plurality of teeth, said second plurality of teeth being sized and spaced to represent said second bit sequence.

* * * * *